(12) United States Patent
Dai

(10) Patent No.: US 8,426,757 B2
(45) Date of Patent: *Apr. 23, 2013

(54) KEYPAD ASSEMBLY AND ELECTRONIC DEVICE USING THE SAME

(75) Inventor: Bin Dai, Shenzhen (CN)

(73) Assignees: Fu Tai Hua Industry (Shenzhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 268 days.

This patent is subject to a terminal disclaimer.

(21) Appl. No.: 12/913,006

(22) Filed: Oct. 27, 2010

(65) Prior Publication Data

US 2012/0061220 A1    Mar. 15, 2012

(30) Foreign Application Priority Data

Sep. 10, 2010   (CN) .......................... 2010 1 0278423

(51) Int. Cl.
*H01H 13/02*        (2006.01)
(52) U.S. Cl.
USPC ............................ 200/343; 200/344; 200/345
(58) Field of Classification Search .......... 200/341–345, 200/296; 400/490–496; 341/22; 345/168, 345/169
See application file for complete search history.

(56) References Cited

U.S. PATENT DOCUMENTS

| 4,468,145 | A  | * | 8/1984  | Denley ........................... | 400/496 |
| 5,844,203 | A  | * | 12/1998 | Chasen et al. ................ | 219/256 |
| 5,901,837 | A  | * | 5/1999  | Aimi ............................. | 200/344 |
| 5,941,373 | A  | * | 8/1999  | Cheng ........................... | 200/344 |
| 6,100,482 | A  | * | 8/2000  | Koma et al. ................... | 200/344 |
| 6,960,734 | B1 | * | 11/2005 | Park ............................... | 200/343 |
| 7,126,071 | B1 | * | 10/2006 | Yang et al. ..................... | 200/344 |
| 8,035,051 | B2 | * | 10/2011 | Yanagida ....................... | 200/343 |
| 2006/0113176 | A1 | * | 6/2006 | Shimizu et al. ............... | 200/343 |

* cited by examiner

*Primary Examiner* — Michael Friedhofer
(74) *Attorney, Agent, or Firm* — Altis Law Group, Inc.

(57) ABSTRACT

A keypad assembly includes a support member, a key switch, a rotation member and a resilient member. The key switch is fixed on the support member, and includes a triggering portion. The keycap is located opposite to the triggering portion. The rotation member is rotatably connected to the keycap. The resilient member includes resilient latching portions latching with the rotation member. The resilient member fixedly interconnects the rotation member and the support member. The rotation member is rotated relative to the resilient member at an angle when the key switch is not triggered, such that the resilient member provides an elastic torque to the rotation member.

20 Claims, 6 Drawing Sheets

KEYPAD ASSEMBLY AND ELECTRONIC DEVICE USING THE SAME

CROSS-REFERENCE TO RELATED APPLICATIONS

This application is related to four co-pending U.S. patent applications No. (12/913,016, 12/915,277, 12/915,280, 12/915,284), all entitled "KEYPAD ASSEMBLY AND ELECTRONIC DEVICE USING THE SAME", by Bin Dai. Such applications have the same assignee as the instant application and are concurrently filed herewith. The disclosure of the above-identified applications is incorporated herein by reference.

BACKGROUND

1. Technical Field

The present disclosure relates to data input assemblies, and particularly, to a keypad assembly used in an electronic device.

2. Description of the Related Art

Electronic devices often provide a keypad on a panel thereof, thus allowing control input for a power source or other component by the user.

A keypad assembly is located on a housing of an electronic device. The housing defines a mounting port in a rear surface of the housing. The keypad assembly includes a keycap and a key switch. The keycap is received in the mounting port, and includes a protrusion arranged at a bottom of the keycap. The key switch includes a triggering portion and a contact point. The triggering portion is a convex resilient sheet. The protrusion resists a top of the triggering portion. When the keycap is depressed, the triggering portion is elastically deformed and electrically connected to the contact point. When the keycap is released, the triggering portion returns to its relaxed state. However, a clearance occurs between the protrusion and the triggering portion, due to manufacturing tolerance or assembly error. The keycap sides in the mounting port end up being without any resistance because of the clearance, such that the contact response of the keypad assembly is lowered.

Therefore, there is room for improvement within the art.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout several views, and all the views are schematic.

DETAILED DESCRIPTION

Figure 1:
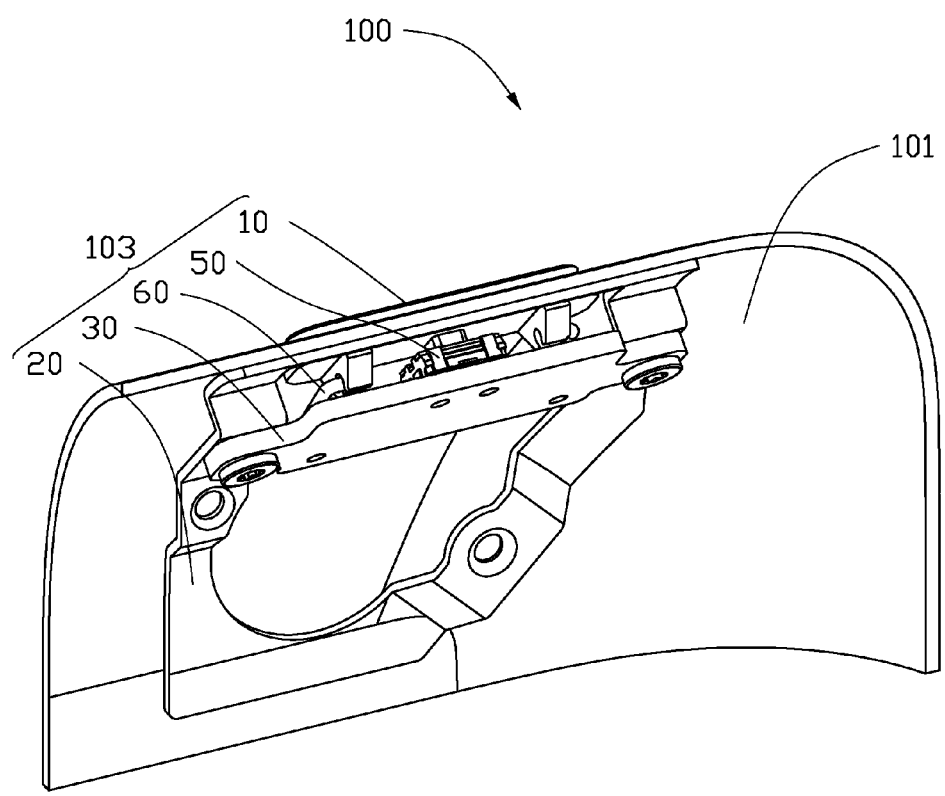
FIG. 1 is a partial, assembled, isometric view of one embodiment of an electronic device including a housing and a keypad assembly mounting on the housing, the keypad assembly including a rotation member and a resilient member.
Figure 2:
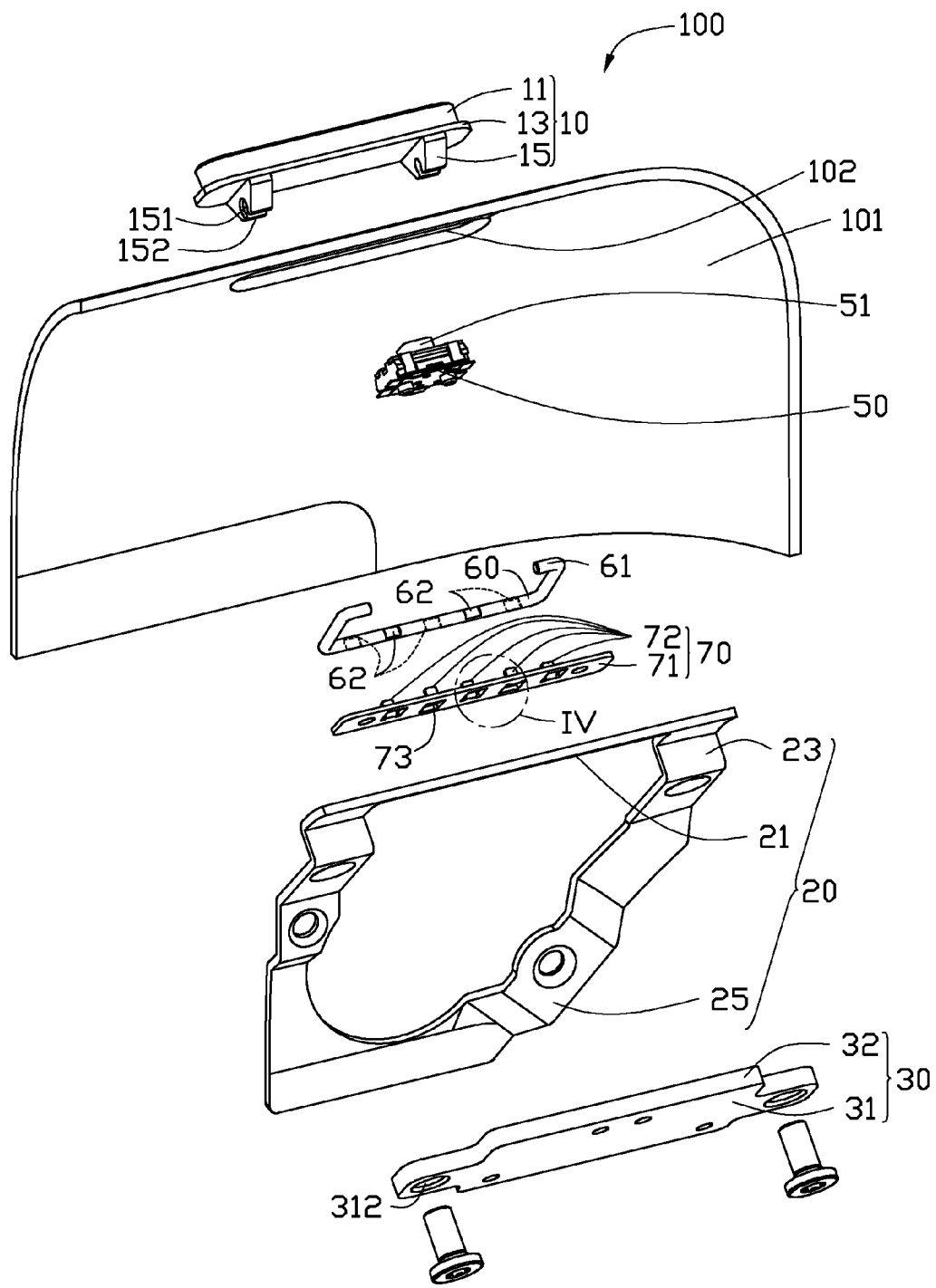
FIG. 2 is an exploded, isometric view of the electronic device shown in FIG. 1.
Figure 3:
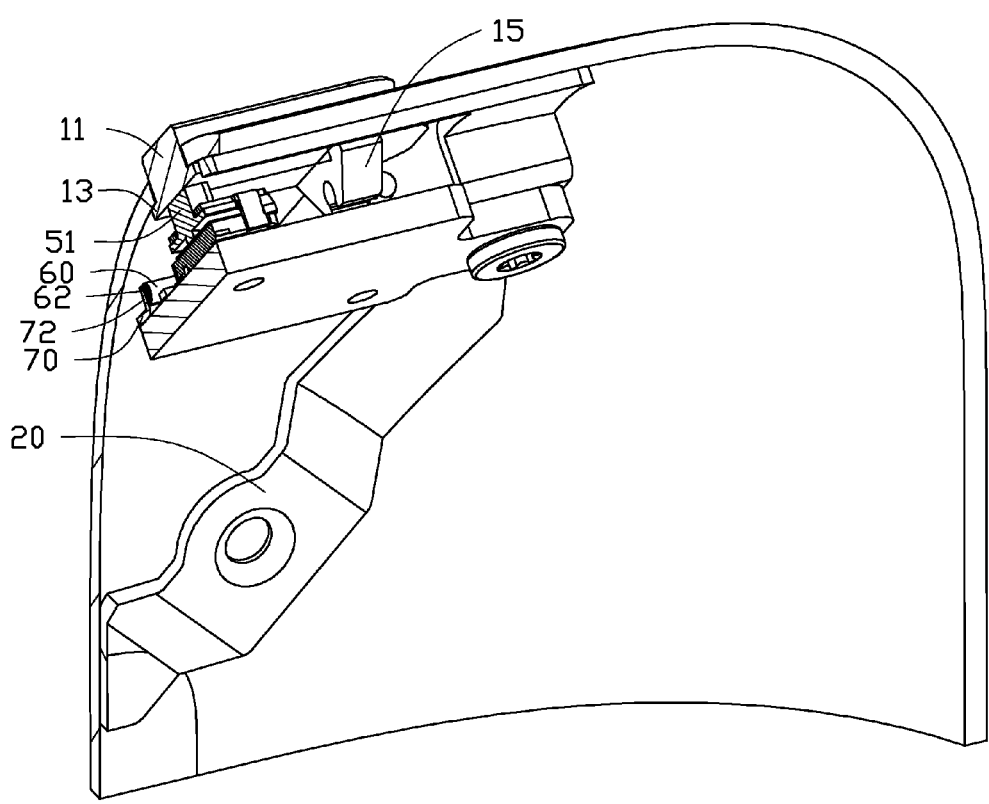
FIG. 3 is a partial cutaway, isometric view of the electronic device shown in FIG. 1.

Referring to FIGS. 1 and 2, an embodiment of an electronic device 100 includes a housing 101 and a keypad assembly 103 located on the housing 101. In the illustrated embodiment, the keypad assembly 103 is a menu button and the housing 101 is an outer case of the electronic device 100. The housing 101 defines a mounting port 102 in the housing 101. In the illustrated embodiment, the mounting port 102 is a through hole.

The keypad assembly 103 includes a keycap 10, a fixing bracket 20, a support member 30, a key switch 50, a rotation member 60, and a resilient member 70. The keycap 10 is partially received in the mounting port 102. The fixing bracket 20 is fixed on an inner surface of the housing 101 adjacent to the mounting port 102. The support member 30 is fixed to the fixing bracket 20, and located opposite to the mounting port 102. The key switch 50 is fixed on the support member 30. The rotation member 60 is rotatably connected to the keycap 10 and fixed to the resilient member 70. The resilient member 70 is also fixed on the support member 30.

The keycap 10 includes a contact portion 11, a limiting portion 13, and two connecting portions 15. The contact portion 11 is substantially oblong and slidably received in the mounting port 102. The limiting portion 13 is arranged at a side of the contact portion 11. The limiting portion 13 is larger than the mounting port 102, such that the contact portion 11 is retained with the mounting port 102. The two connecting portions 15 are located at opposite ends of an outer surface of the limiting portion 13. In the illustrated embodiment, each connecting portion 15 defines a pivotal hole 151 in the center of the corresponding connecting portion 15 and a gap 152 communicating with the pivotal hole 151.

The fixing bracket 20 includes a first fixing portion 21, two second fixing portions 23, and a third fixing portion 25. The first fixing portion 21 is substantially rectangular and fixed in an inner side of the housing 101. The two second fixing portions 23 extend from opposite ends of the first fixing portion 21, and fixed to opposite ends of the third fixing portion 25. The first fixing portion 21, the second fixing portions 23 and the third fixing portion 25 cooperatively form a substantially closed bracket. In this embodiment, the first fixing portion 21 is fixed on an inner side of housing 101 by welding. The third fixing portion 25 is used to fix other components (not shown) of the electronic device 100.

The support member 30 includes a main body 31 and a support portion 32 located at the center of a side of the main body 31. The main body 31 defines two through holes 312 in opposite ends of the main body 31. The main body 31 is fixed on the second fixing portion 23 of the fixing bracket 20 via a plurality of threaded fasteners (not shown) received in the through holes 312.

The key switch 50 is fixed on the support portion 32 of the support member 30, and includes a triggering portion 51. The limiting portion 13 of the keycap 10 contacts the triggering portion 51 to trigger the key switch 50. In this embodiment, the key switch 50 is fixed on the support member 30 by welding.

The rotation member 60 is substantially U-shaped, and has two ends extending inward. In the illustrated embodiment, the rotation member 60 is made from a steel wire. The rotation member 60 defines a plurality of latching grooves 62 thereon, and the latching grooves 62 are arranged apart at two opposite sides of the rotation member 60. In the illustrated embodiment, there are five latching grooves 62 defined on the rotation member 60. Two of the latching grooves 62 are defined at a side of the rotation member 60 adjacent to two ends 61 of the rotation member 60, and other three latching grooves 62

(shown in dashed line of FIG. 2) are defined on an opposite side of the rotation member 60 away from the two ends 61 of the rotation member 60.

Figure 4:
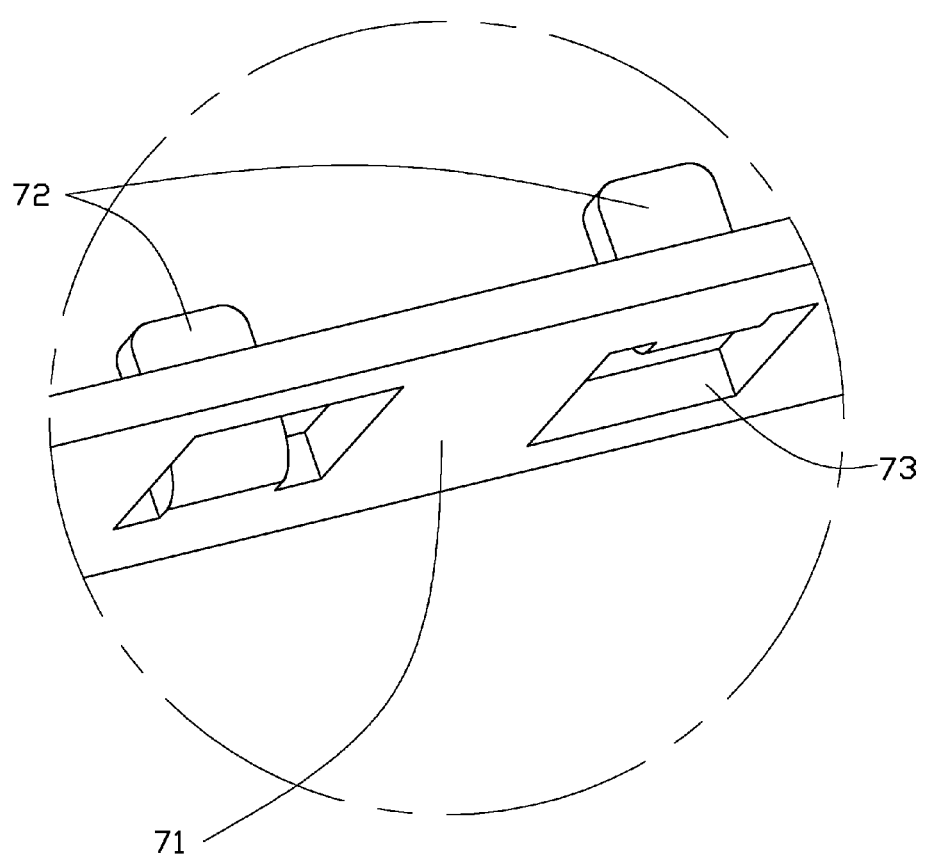
FIG. 4 is an enlarged, partial view of the circle IV shown in FIG. 2.
Figure 5:
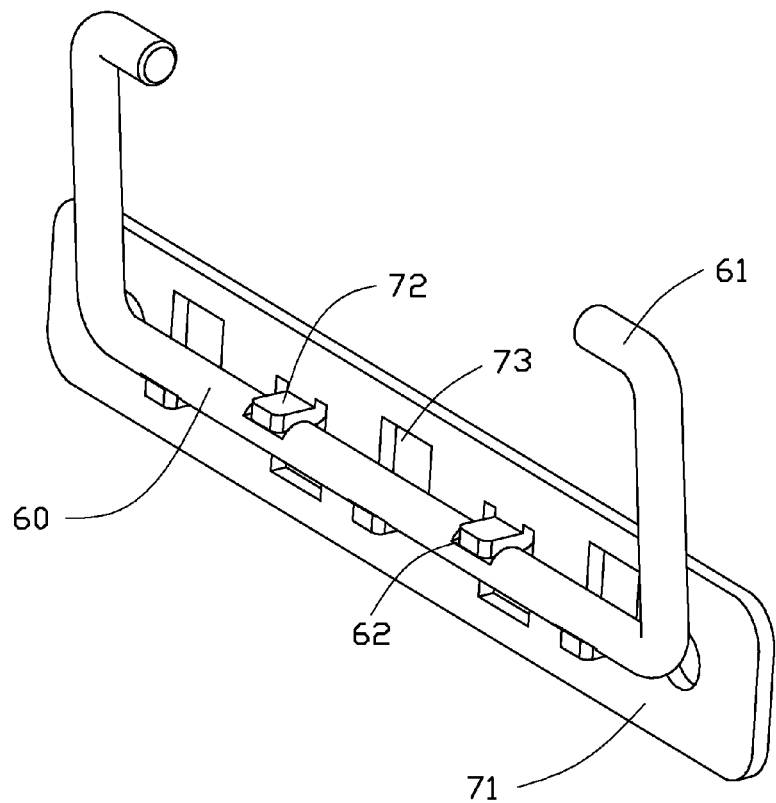
FIG. 5 is an assembled, isometric view of the rotation member and the resilient member shown in FIG. 1.
Figure 6:
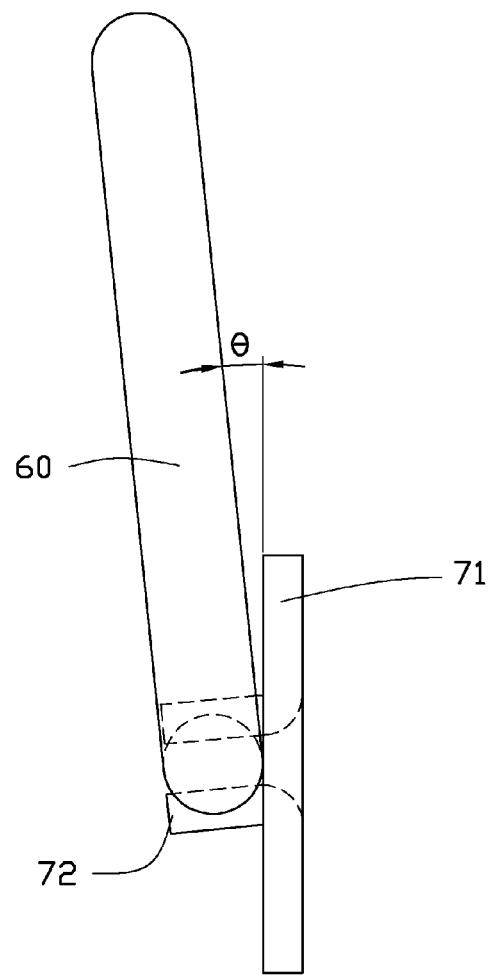
FIG. 6 is a side view of the rotation member and the resilient member show in FIG. 5.

Referring to FIGS. 2 and 4, the resilient member 70 includes a fixing portion 71 and a number of resilient latching portions 72 arranged on the fixing portion 71 according to the latching grooves 62 of the rotation member 60. In the illustrated embodiment, the fixing portion 71 is integrally formed with the resilient latching portions 72. There are five resilient latching portions 72 on the fixing portion 71, and each resilient latching portion 72 protrudes from a side of a corresponding opening 73. Two resilient latching portions 72 protrudes from a same side of corresponding openings 73, for correspondingly latching with the latching grooves 62 adjacent to the two ends 61 of the rotation member 60, and the other three resilient latching portions 72 protrude from an opposite side of corresponding opening 73, for correspondingly latching with the latching grooves 62 away from the two ends 61 of the rotation member 60.

Referring to FIGS. 2 to 6, during assembly of the keypad assembly 103, a middle portion of the rotation member 60 is latched in the resilient latching portions 72 of the resilient member 70. The rotation member 60 is rotated relative to the resilient member 70 to define an included angle cooperative with the resilient member 70, and "θ" represents the included angle, which results in the latching groove 62 of the rotation member 60 elastically abutting the inner surfaces of the resilient latching portions 72 (shown in FIG. 6), such that the resilient latching portions 72 of the resilient member 70 provide an elastic torque or capability for elastic deformation to the rotation member 60. The two ends 61 of the rotation member 60 are received in the pivotal holes 151 of the keycap 10 via the gaps 152, such that the rotation member 60 is rotatable relative to the keycap 10. The contact portion 11 of the keycap 10 is received in the mounting port 102 of the housing 101. The first fixing portion 21 of the fixing bracket 20 is fixed on an inner side of the housing 101. The opposite ends of the main body 31 of the support member 30 are connected to the two second fixing portions 23 of the fixing bracket 20. The key switch 50 is fixed on a side of the support member 30. The fixing portion 71 of the resilient member 70 is fixed on the support member 30.

When depressed, the keycap 10 slides toward the triggering portion 51 of the key switch 50 until the key switch 50 is triggered. When the keycap 10 is released, the triggering portion 51 of the key switch 50 returns to a relaxed state and resists the keycap 10. The rotation member 60 rotates relative to the resilient member 70 to define the angle "θ" between the rotation member 60 and the resilient member 70, such that the resilient latching portions 72 of the resilient member 70 provide an elastic torque or capability for elastic deformation to the rotation member 60. Thus, the limiting portion 13 of the keycap 10 tightly contacts the triggering portion 51 of the key switch 50, such that the keypad assembly 103 provides an acceptable resistance.

It should be pointed out that the elastic torque of the rotation member 60 provided by the resilient latching portions 72 of the resilient member 70 is less than the biasing force provided by the keycap 10, so that the key switch 50 is prevented from being triggered inadvertently.

It is to be understood that the fixing bracket 20 can also be omitted, correspondingly, wherein the support member 30 is fixed on an inner side of the housing 101.

Finally, while the present disclosure has been described with reference to particular embodiments, the description is illustrative of the disclosure and is not to be construed as limiting the disclosure. Therefore, various modifications can be made to the embodiments by those of ordinary skill in the art without departing from the true spirit and scope of the disclosure as defined by the appended claims.

What is claimed is:

1. A keypad assembly comprising:
   a support member;
   a key switch fixed on the support member and comprising a triggering portion;
   a keycap located opposite to the triggering portion;
   a rotation member rotatably connected to the keycap; and
   a resilient member fixedly interconnecting the rotation member and the support member, wherein the rotation member is rotated relative to the resilient member to define an angle between the rotation member and the resilient member when the key switch is not triggered, such that the resilient member provides an elastic torque to the rotation member.

2. The keypad assembly of claim 1, wherein the keycap comprises a contact portion, a limiting portion arranged at a side of the contact portion and two connecting portions located at opposite ends of an outer surface of the limiting portion respectively, wherein the rotation member is rotatably connected to the two connecting portions.

3. The keypad assembly of claim 2, wherein each connecting portion defines a pivotal hole and a gap communicating with the pivotal hole, with opposite ends of the rotation member received in the pivotal holes via the gaps.

4. The keypad assembly of claim 1, further comprising a fixing bracket fixed to the support member.

5. The keypad assembly of claim 4, wherein the support member comprises a main body and a support portion located at the center of a side of the main body, and the key switch is fixed on the support portion.

6. The keypad assembly of claim 5, wherein the fixing bracket comprises a first fixing portion and two second fixing portions extending from opposite ends of the first fixing portion, and opposite ends of the main body are fixed on the two second fixing portions.

7. The keypad assembly of claim 1, wherein the resilient member comprises a fixing portion and a plurality of resilient latching portions arranged on the fixing portion, and a middle portion of the rotation member is latched in the resilient latching portions.

8. A keypad assembly comprising:
   a support member;
   a resilient member fixed on the support member;
   a key switch fixed on the support member and comprising a triggering portion;
   a keycap located opposite to the triggering portion; and
   a resilient member fixedly interconnecting the rotation member and the support member, wherein the resilient member comprises a plurality of resilient latching portions, a middle portion of the rotation member is latched in the resilient latching portions, the resilient latching portions is capable of elastically deforming, and is resumed to deform when the keycap biases the triggering portion.

9. The keypad assembly of claim 8, wherein the keycap comprises a contact portion, a limiting portion arranged at a side of the contact portion and two connecting portions located at opposite ends of an outer surface of the limiting portion respectively, wherein the rotation member is rotatably connected to the two connecting portions.

10. The keypad assembly of claim 9, wherein each connecting portion defines a pivotal hole and a gap communicating with the pivotal hole, with opposite ends of the rotation member received in the pivotal holes via the gaps.

11. The keypad assembly of claim 8, further comprising a fixing bracket fixed to the support member.

12. The keypad assembly of claim 11, wherein the support member comprises a main body and a support portion located at the center of a side of the main body, and the key switch is fixed on the main body.

13. The keypad assembly of claim 12, wherein the fixing bracket comprises a first fixing portion and two second fixing portions extending from opposite ends of the first fixing portion, and opposite ends of the main body are fixed on the two second fixing portions.

14. An electronic device comprising:
a housing defining a mounting port; and
a keypad assembly located on the housing, the keypad assembly comprising:
a support member fixed to the housing;
a key switch fixed on the support member and comprising a triggering portion;
a keycap located opposite to the triggering portion and partially received in the mounting port;
a rotation member rotatably connected to the keycap; and
a resilient member fixedly interconnecting the rotation member and the support member, wherein the rotation member is rotated relative to the resilient member to define an angle between the rotation member and the resilient member when the key switch is not triggered, such that the resilient member provides an elastic torque to the rotation member.

15. The electronic device of claim 14, wherein the keycap comprises a contact portion, a limiting portion arranged at a side of the contact portion and two connecting portions located at opposite ends of an outer surface of the limiting portion respectively, wherein the rotation member is rotatably connected to the two connecting portions.

16. The electronic device of claim 15, wherein each connecting portion defines a pivotal hole and a gap communicating with the pivotal hole, with opposite ends of the rotation member received in the pivotal holes via the gaps.

17. The electronic device of claim 14, wherein the keypad assembly further comprises a fixing bracket fixed to the support member.

18. The electronic device of claim 17, wherein the support member comprises a main body and a support portion located at the center of a side of the main body, and the key switch is fixed on the support portion.

19. The electronic device of claim 18, wherein the fixing bracket comprises a first fixing portion and two second fixing portions extending from opposite ends of the first fixing portion, and opposite ends of the main body are fixed on the two second fixing portions.

20. The electronic device of claim 14, wherein the resilient member comprises a fixing portion and a plurality of resilient latching portions arranged on the fixing portion, and a middle portion of the rotation member is latched in the resilient latching portions.

* * * * *